US005998908A

United States Patent [19]

Goodson

[11] Patent Number: 5,998,908

[45] **Date of Patent: *Dec. 7, 1999**

[54] TRANSDUCER ASSEMBLY HAVING CERAMIC STRUCTURE

[75] Inventor: J. Michael Goodson, Skillman, N.J.

[73] Assignee: Crest Ultrasonics Corp., Trenton, N.J.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/853,423

[22] Filed: May 9, 1997

Related U.S. Application Data

[63] Continuation-in-part of application No. 08/792,568, Jan. 31, 1997, abandoned, which is a continuation-in-part of application No. 08/644,843, May 19, 1996, Pat. No. 5,748,566

[60] Provisional application No. 60/038,961, Feb. 24, 1997, and provisional application No. 60/039,228, Feb. 28, 1997.

[51] Int. Cl.[6] .................... H01L 41/08

[52] U.S. Cl. .................... 310/325; 310/328; 310/334

[58] Field of Search .................... 310/323, 325, 310/321

[56] References Cited

U.S. PATENT DOCUMENTS

| | | | |
|---|---|---|---|
| 2,998,535 | 8/1961 | Church et al. | 310/325 X |
| 3,187,207 | 6/1965 | Tomes | 310/325 |
| 3,575,383 | 4/1971 | Coleman | 259/72 |
| 3,777,189 | 12/1973 | Skinner et al. | 310/325 X |
| 3,937,990 | 2/1976 | Winston | 310/325 |
| 4,129,850 | 12/1978 | Mumper | 340/10 |
| 4,193,009 | 3/1980 | Durley, III | 310/323 |
| 4,219,889 | 8/1980 | Parssinen | 367/158 |
| 4,602,184 | 7/1986 | Meitzler | 310/323 X |
| 4,633,119 | 12/1986 | Thompson | 310/325 |
| 4,798,990 | 1/1989 | Henoch | 310/321 X |
| 5,748,566 | 5/1998 | Goodson | 310/328 X |

FOREIGN PATENT DOCUMENTS

| | | | |
|---|---|---|---|
| 0050898 | 3/1983 | Japan | 310/325 |
| 1331100 | 9/1973 | United Kingdom | 310/325 |

*Primary Examiner*—Mark O. Budd
*Attorney, Agent, or Firm*—Limbach & Limbach L.L.P.

[57] ABSTRACT

An ultrasonic transducer for generating and transmitting ultrasonic wave energy of a predetermined frequency to the surface of an object. The head mass and the tail mass are made from ceramic materials such as silicon carbide or alumina. In a particularly preferred embodiment, the transducer stack includes a resonance enhancing disc also made from ceramic material.

9 Claims, 5 Drawing Sheets

TRANSDUCER ASSEMBLY HAVING CERAMIC STRUCTURE

RELATED APPLICATIONS

This application is a continuation-in-part of: application Ser. No. 08/792,568, filed Jan. 31, 1997, now abandoned, entitled ULTRASONIC TRANSDUCER, which was in turn a continuation-in-part of application Ser. No. 08/644,843, filed May 9, 1996, now U.S. Pat. No. 5,748,566, entitled ULTRASONIC TRANSDUCER; priority is also claimed from provisional application No. 60/038,961, filed Feb. 24, 1997, entitled ULTRASONIC TRANSDUCER; and provisional application No. 60/039,228, filed Feb. 28, 1997, entitled CERAMIC TRANSDUCER ASSEMBLY. Each of these disclosures is expressly incorporated herein by reference.

FIELD OF THE INVENTION

This invention relates to transducers which generate and transmit energy in the ultrasonic or megasonic ranges, and more particularly, to a transducer wherein ceramic materials, preferably silicon carbide or alumina oxide, are used as a resonator and/or substituted for metallic materials in such transducers.

BACKGROUND OF THE INVENTION

Ultrasonic transducers are used for generating and transmitting wave energy of a predetermined frequency to a liquid contained in a container. See, for example, U.S. Pat. No. 3,575,383 entitled ULTRASONIC CLEANING SYSTEM, APPARATUS AND METHOD THEREFOR. Transducers of this type can be used, for example, in ultrasonic cleaning equipment. The transducer is typically mounted to the side or the underside of a container which holds liquid, or mounted in a sealed enclosure which is immersed in a liquid in a container made of metal, plastic or glass. A single transducer or a plurality of transducers are then used to energize the liquid with sonic energy. Once energized with the sonic energy, the liquid achieves cavitation.

This type of transducer is also referred to as a "sandwich"-type transducer because it has one or more crystals sandwiched between a head mass (or front driver) and the tail mass (or rear driver). A sandwich-type of transducer is used in applications such as plastic welding, wire bonding, cataract and other medical surgical devices, among others.

Currently, some of the transducer elements are made from metallic materials including stainless steel, aluminum and titanium. Applicant has proposed using an additional element, called a resonator, to enhance the output of the transducer relative to conventional transducers, as disclosed in co-pending application Ser. Nos. 08/644,843, and 08/792,568. In one embodiment, ceramic material is identified as a preferred material for the resonator element.

It has now been discovered, however, that even greater advantages can be obtained where ceramic materials are substituted for the metal components of a transducer and/or other structures used to generate and transmit ultrasonic energy.

SUMMARY OF THE INVENTION

An ultrasonic transducer for generating and transmitting ultrasonic wave energy of a predetermined frequency includes a head mass and tail mass made from ceramic materials such as silicon carbide or alumina. In a particularly preferred embodiment, the transducer stack includes a resonator also made from ceramic material.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

The present invention substitutes ceramic materials for metallic materials in a transducer stack thereby resulting in an enhanced device having superior acoustical performance, as will now be described in more detail.

Figure 1:
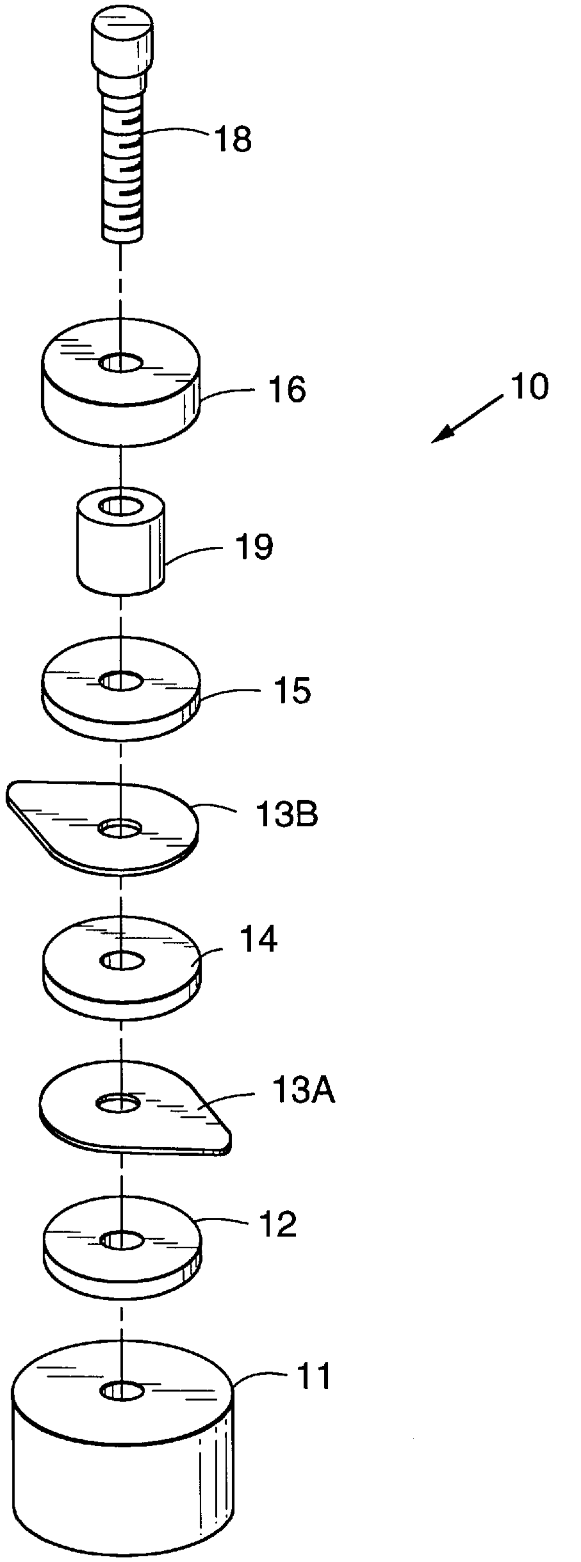
FIG. 1 is an exploded perspective view of a transducer according to the present invention.

A preferred embodiment of an ultrasonic transducer 10 in accord with the present invention is shown in FIG. 1. The transducer includes a base or head mass 11, a resonance enhancing disc or resonator 12, electrodes 13*a* and 13*b*, a piezoelectric crystal 14, an insulating member 15, a reflector or tail mass 16, a bolt 18, and phenolic insert 19.

The base or head mass 11 is suitable for attachment to the surface of a container, such as a cleaning tank. In a conventional transducer stack, the head mass 11 would be made from a suitable metal, typically aluminum or stainless steel. Also, the tail mass 16 would typically be steel or leaded steel.

However, in accord with the present invention, the head mass and tail mass is made from a ceramic material, preferably silicon carbide or alumina oxide.

As disclosed in co-pending application Ser. Nos. 08/644,843, and 08/792,568, it is advantageous to have resonator 12 in the stack, which may also be made from ceramic material such as alumina oxide or silicon carbide. However, the inclusion of the resonator 12 is not required to practice the present invention, although it is certainly recommended for maximum benefit.

A piezoelectric crystal 14 is located between the two metal electrodes 13*a* and 13*b*. The crystal 14 is typically made of lead zirconate titanate and, in one embodiment, ranges from 0.50 to 4.00 inches in diameter and 0.10 to 0.50 inches thick.

All of the components described above are assembled and coupled to the base mass 11 by tightening the bolt 18 to a torque pressure ranging from 150 inch-pounds for low power applications to 500 foot-pounds for high power applications. Optimally, the torque pressure is between 200 to 300 inch-pounds for low power applications (5 to 25 watts), and between 300 to 500 foot-pounds for high power applications (up to 3000 watts).

The thicknesses of the base mass 11, the resonator 12 and the reflector 16 are selected as an integral multiple of one-quarter of the wavelength (λ/4) of the longitudinal sound vibrations in the medium. The acoustic properties of ceramic, metal and other materials are readily identified in the art. See, for example, Selfridge, "Approximate Material Properties in Isotropic Materials," ISEE Transactions on Sonics and Ultrasonics (Vol. SU-32, No. 3, May 1985), which is incorporated herein by reference. Thus, the appropriate selection of materials for use in transducer stack assemblies according to the present invention can readily be made by reference to such art.

It has been found that certain ceramic materials have adequate physical characteristics so as to be interchangeable with metals, but also possess superior acoustical properties. In building ultrasonic devices or transducers to transmit ultrasonic sound, it is therefore possible to substitute ceramic materials, such as aluminum oxide or silicon carbide, for metals (predominately stainless steel, aluminum and titanium) in the base 11 and the reflector 16, resulting in superior acoustical properties which: (1) improves and enhances performance of existing frequencies; (2) makes it easier to find higher frequencies; and (3) allows the use of lower frequency PZT's to create higher frequencies with the same power as lower frequencies, which was previously impossible with all metal head and tail mass (or head mass only) designs.

Ceramics such as alumina oxide and silicon carbide can provide better flatness, and can meet or exceed the requirements for strength and durability of the metals and still yield improved acoustical performance, as shown by the relative acoustical properties of selected materials listed in Table 1:

TABLE 1

| Material | Acoustical Index |
|---|---|
| Metals | |
| Aluminum | 6.42 |
| Stainless steel | 5.79 |
| Titanium | 6.10 |
| Ceramics | |
| Aluminum oxide | 10.52 |
| Silicon carbide | 13.06 |

Thus, for example, silicon carbide has a 2.034 superiority advantage over aluminum with aluminum being the best of the available metals being used today in most applications. This results from a calculation of 13.06 (silicon carbide index)÷6.42 (aluminum index)=2.034. For example, if a 0.2 inch resonator is made from silicon carbide, and inserted in the stack in place of one made from aluminum, the stack would require removal of 0.4068 inches of aluminum. Likewise, if you converted a 1 inch aluminum head mass in its entirety to silicon carbide, the height of the head mass becomes 1÷(13.06÷6.42)=0.4915 inches. The tail mass likewise is converted through the use of the appropriate acoustical index.

The entire transducer or transmitting device will show improvement if all parts are made from ceramics having superior acoustical properties than the metals they replace.

Silicon carbide is a superior ceramic for building all parts of transducers or devices to transmit ultrasonic sound. Silicon carbide is flatter, harder (except for diamonds), more durable and acoustically superior relative to other known metals or materials, or ceramics. Silicon carbide can be used as a resonator, head mass, tail mass, or vessel of transmission as follows: (1) as a resonating vessel to hold liquid that is being excited ultrasonically for cleaning, rinsing, degreasing, coating, processing and etc.; (2) as the transmitting device with ultrasonic liquid processors; (3) as the capillary or wedge used with an ultrasonic wire or wedge bonding machine; (4) as a horn to receive the acoustical signals from a plastic assembly or welding machine converter mechanism; (5) as a triggering device to detonate a missile, torpedo, or other explosive device fired with ultrasonics; or (6) as a transmitter of sound for ultrasonic welding or bonding.

Silicon carbide is superior in acoustical properties to other ceramics used in wire-bonding and wedge bonding which get their energy from ultrasonics: (1) it is superior for capillary design based on its 13.06 acoustical index rating as compared with aluminum oxide (10.52); and (2) it is superior to tungsten carbide (11.0) as used for wedge bonding.

Figure 2A:
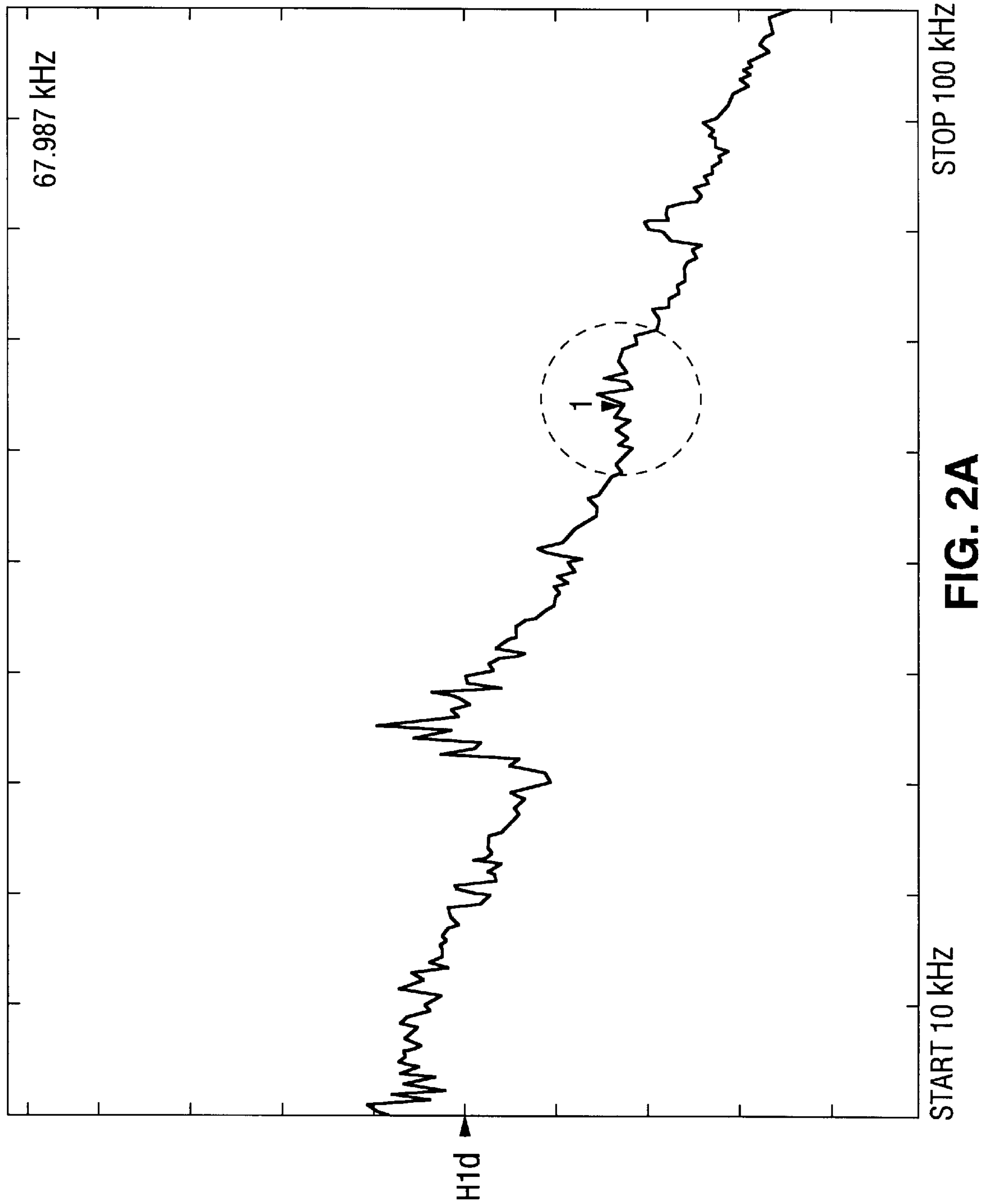
FIG. 2*a* is a graphical representation of the signal and impedance as a function of frequency generated by a prior art transducer having metal components.
Figure 2B:
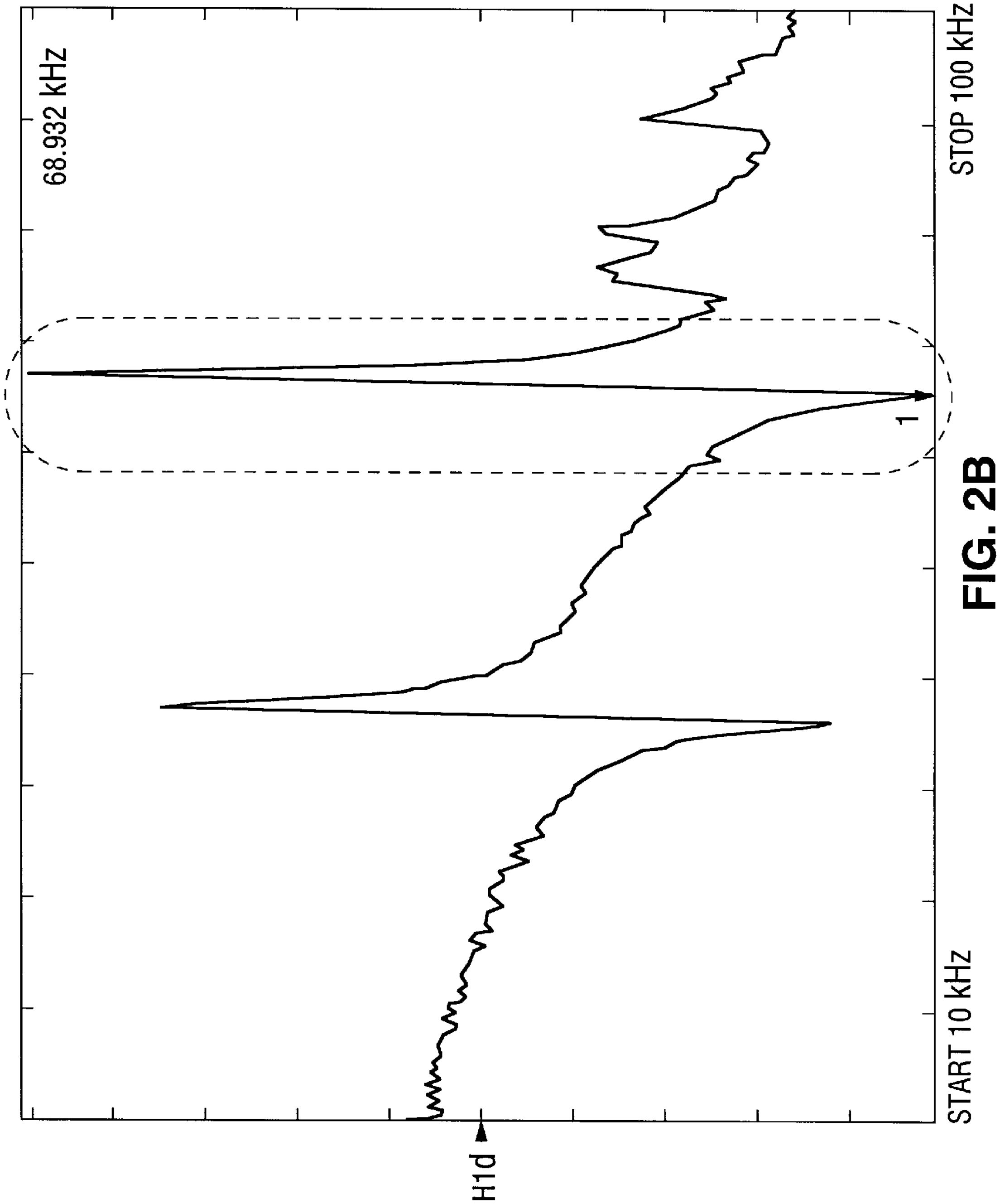
FIG. 2*b* is a graphical representation of the signal and impedance as a function of frequency generated by a transducer in accord with the present invention.

The performance improvement with substitution of ceramics for metals can be seen in FIGS. 2*a* and 2*b*, which illustrate an ultrasonic cleaning transducer involving 3,000 to 5,000 watts in a single group of transducers. FIG. 2*a* illustrates the signal generated by a 68 kHz stacked transducer having metal components, while FIG. 2*b* illustrates the signal generated by a 68 kHz stacked transducer having ceramic components. Note the sharp peak in the signal of the ceramic transducer stack as compared to the metal stack. Further, the impedance fell from 84.613 to 37.708 when ceramics were substituted for metals. Lower impedance is associated with better transmission of sound and greater efficiency.

Figure 3A:
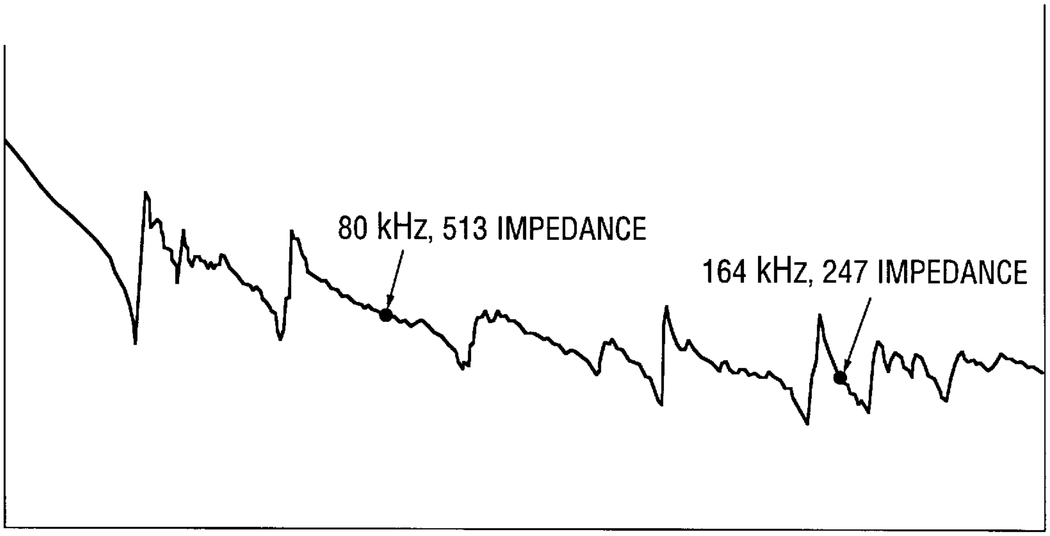
FIG. 3*a* is a graphical representation of the signal and impedance as a function of frequency generated by a prior art transducer having metal components.
Figure 3B:
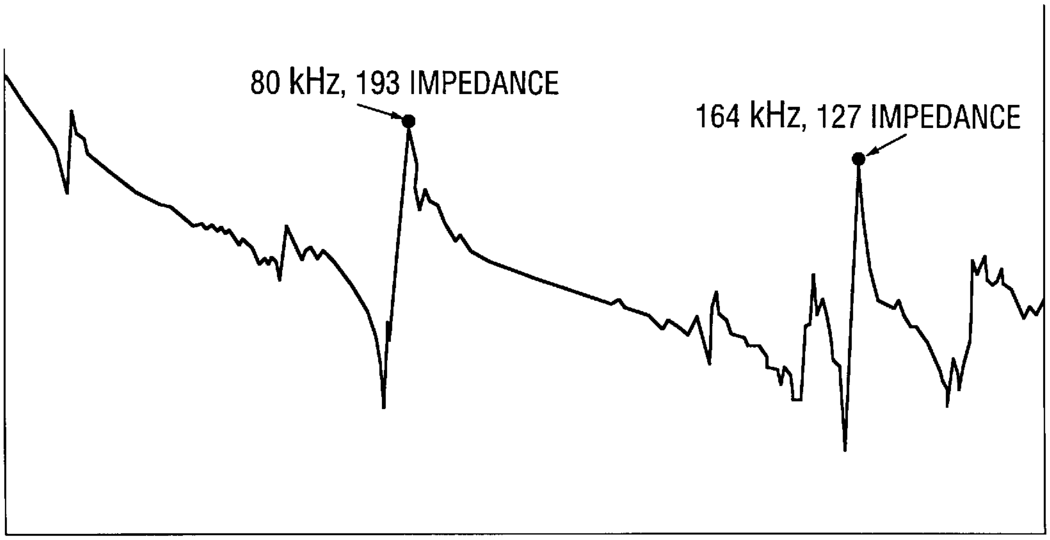
FIG. 3*b* is a graphical representation of the signal and impedance as a function of frequency generated by a transducer in accord with the present invention.

Another example of the improvement obtained when ceramics are substituted for metals in low power transducer applications (10 to 15 watts) is shown in FIGS. 3*a* and 3*b*. FIG. 3*a* shows the signal generated by a transducer stack having metal components, while FIG. 3*b* shows the signal generated by a transducer stack having ceramic components. It can be seen the ceramic stack pictured in FIG. 3*b* produces two usable frequencies, namely 80 kHz with an impedance of 193 ohms, and 164 kHz with an impedance of 127 ohms.

In light of the foregoing, those familiar with transducers and ultrasonics generally will appreciate that the invention has applications in numerous areas, including but not limited to ultrasonic cleaning or precision cleaning, ultrasonic plastic assembly or plastic welding, ultrasonic friction welding, ultrasonic wire bonding (e.g. with gold or aluminum wire), ultrasonic wedge bonding, ultrasonic thermosonic bonding (ball bonding), non destructive ultrasonic testing equipment, ultrasonic cell disrupters (also known as liquid processors), ultrasonic emulsifiers, megasonic ultrasonics for frequencies from 200–1200 kHz, medical ultrasonics, and nebulizers.

Other possible applications include:

Military: hydrophones, depth sounders, fuse devices, level indicators, pingers, missile launchers, missile, sonobuoys, targets, telephony, subsurface bottom profiling, ring laser gyros, torpedo launchers, torpedo.

Automotive: knock sensors, radio filters, tread wear indicators, fuel atomization, spark ignition, keyless door entry, wheel balancers, seat belt, buzzers, air flow and tire pressure indicators, audible alarms.

Commercial: ultrasonic aqueous, cleaners, ultrasonic semi-aqueous cleaners, ultrasonic wire bonding, ultrasonic wedge bonding, thickness gauging, level indicators, geophones, tv and radio resonators, ignition systems, relays, non destructive material testing, liquid processors, ultrasonic plastic welders, ultrasonic sewing machine, ultrasonic degreasers, flaw detection, flow meters, ultrasonic drilling, delay lines, airplane beacon locators, fans, ink printing, alarm systems.

Medical: micro brain surgery, ultrasonic cataract, removal, insulin pumps, flow meters, ultrasonic imaging, vaporizers, liquid processors, ultrasonic scalpels, ultrasonic therapy, fetal heart detectors, nebulizers, disposable patient monitors, ultrasonic dental devices, cell disrupters.

Consumer: humidifiers, telephone devices, microwave ovens, phonograph cartridges, cigarette lighters, musical instruments, fish finders, gas grill igniters, smoke detectors, jewelry cleaners, speakers, security lighting, ultrasonic sewing.

Figure 4:
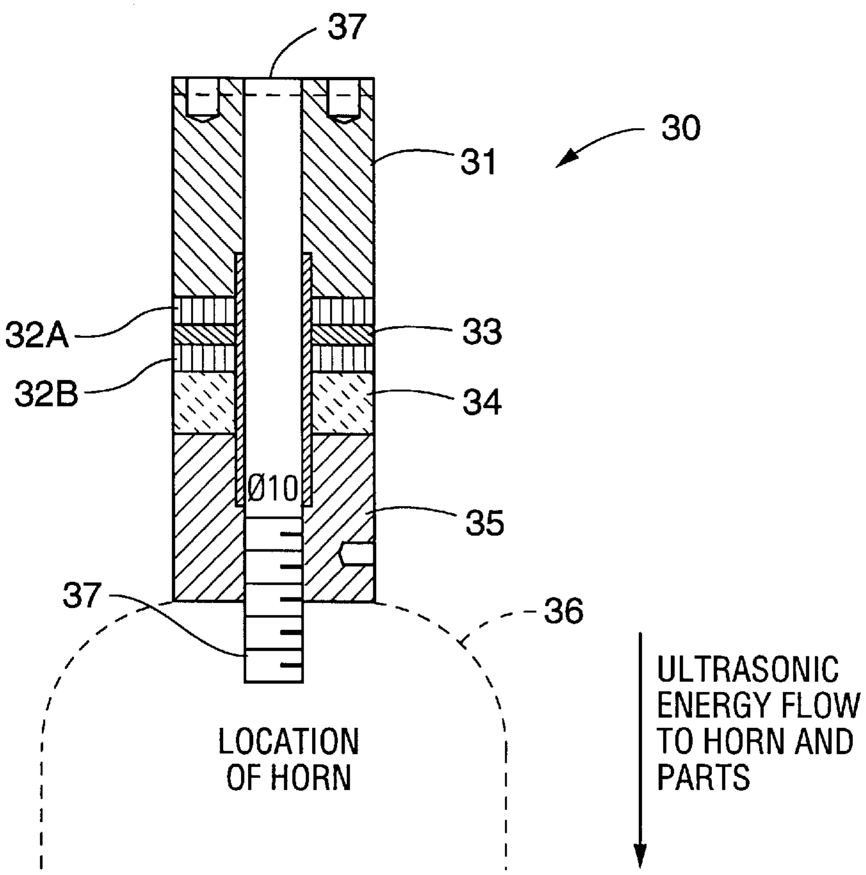
FIG. 4 is a schematic representation of a transducer assembly of the present invention used for ultrasonic welding for plastics assembly.
Figure 5:
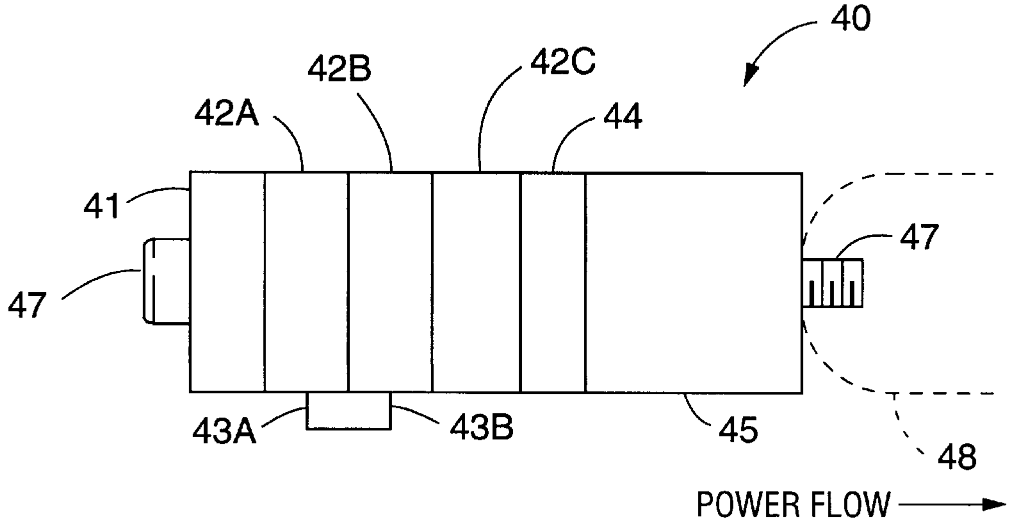
FIG. 5 is a schematic representation of a transducer assembly of the present invention used for ultrasonic welding for wire bonding.

Referring now to FIGS. 4 and 5, other embodiments of the invention will be described.

FIG. 4 shows an arrangement which includes a transducer stack 30 for use in ultrasonic plastic welding. In this stack, there is a ceramic tail mass or back driver 31, piezoelectric crystals 32*a* and 32*b*, an aluminum electrode 33 positioned between the crystals, a ceramic resonator 34 and a ceramic head mass or front driver 35. For this use, the transducer 30 is connected to a welding horn 36 by bolt 37 such that the head mass 35 is in contact with the welding horn. The welding horn 36 interfaces with the parts being ultrasonically bonded. This device is also generally known as a converter, and can handle high power plastic welding requirements up to 3000 watts.

FIG. 5 shows a transducer stack 40 for use in wire bonding. In this stack, there is a ceramic tail mass or back driver 41, piezoelectric crystals 42*a*, 42*b* and 42*c*, interlocking brass electrodes 43*a* and 43*b*, a ceramic resonator 44 and a ceramic head mass or front driver 45. For this use, the transducer 40 is connected to a horn 48 by screw or bolt 47 in the same manner as the previous embodiment such that the head mass 45 is in contact with the horn. This device is also generally known as a motor for wire bonding, and can handle low power bonding requirements of approximately 10 to 15 watts.

In most instances, it may be advantageous to have a ceramic resonator and an intervening ceramic mass rather than have a single ceramic mass.

It may also be possible to remove the head mass altogether and have direct bonding between either the crystal or the resonator and the surface of interest.

In summary, this invention relates to an improved ultrasonic transducer or transducer apparatus for generating and transmitting ultrasonic wave energy of a predetermined frequency. The improvement resides in the substitution of ceramic material, preferably silicon carbide or alumina oxide, for metal components in a transducer stack.

Once those skilled in the art understand the advantages of substituting ceramic materials for metals as disclosed herein, the required thicknesses for elements in a transducer stack may be readily identified for optimal performance, and the specific geometries required for specific applications can be readily determined.

It should be understood, however, that the invention is not intended to be limited by the specifics of the above-described embodiments, but rather defined by the accompanying claims.

I claim:

1. An ultrasonic transducer stack for generating and transmitting sonic energy to a surface of interest, comprising:

a piezoelectric crystal, a head mass made from ceramic material and positioned between the piezoelectric crystal and the surface of interest, a resonator made from ceramic material and positioned between the head mass and the piezoelectric crystal, a tail mass made from ceramic material and positioned adjacent to the piezoelectric crystal opposite the head mass, and means for compressing the head mass, resonator, piezoelectric crystal, and tail mass.

2. An ultrasonic transducer as in claim 1, further comprising an insulator made from ceramic material and positioned between the tail mass and the piezoelectric crystal.

3. A transducer stack as in claim 1, wherein the ceramic material is silicon carbide or alumina oxide.

4. A transducer stack as in claim 2, wherein the ceramic material is silicon carbide or alumina oxide.

5. A transducer stack as in claim 1, further comprising a first electrode positioned between the head mass and the piezoelectric crystal and a second electrode positioned between the tail mass and the piezoelectric crystal.

6. An ultrasonic transducer stack for generating and transmitting sonic energy to a surface of interest, comprising:

a head mass made from ceramic material and coupled to the surface of interest, a tail mass made from ceramic material, at least two piezoelectric crystals positioned between the head mass and the tail mass, an electrode positioned between the at least two piezoelectric crystals, a resonator made from ceramic material and positioned between the head mass and the piezoelectric crystals, and means for compressing the head mass, resonator, piezoelectric crystals, electrode, and tail mass.

7. A transducer stack as in claim 6, wherein the ceramic material is silicon carbide or alumina oxide.

8. An ultrasonic transducer stack for generating and transmitting sonic energy to a surface of interest, comprising:

a head mass made from ceramic material and coupled to the surface of interest, a tail mass made from ceramic material, a plurality of piezoelectric crystals positioned between the head mass and the tail mass, an electrode positioned between at least two of the piezoelectric crystals, a resonator made from ceramic material and positioned between the head mass and the piezoelectric crystals, and means for compressing the head mass, resonator, piezoelectric crystals, electrode, and tail mass.

9. A transducer stack as in claim 8, wherein the ceramic material is silicon carbide or alumina oxide.

* * * * *